(12) United States Patent
Agarwala et al.

(10) Patent No.: US 8,782,581 B2
(45) Date of Patent: Jul. 15, 2014

(54) TEST BENCH HIERARCHY AND CONNECTIVITY IN A DEBUGGING ENVIRONMENT

(71) Applicant: Mentor Graphics Corporation, Wilsonville, OR (US)

(72) Inventors: Badruddin Agarwala, Pleasanton, CA (US); Tarak Parikh, San Jose, CA (US); Vivek Bhat, San Jose, CA (US); Neeraj Joshi, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/941,234

(22) Filed: Jul. 12, 2013

(65) Prior Publication Data

US 2014/0019923 A1     Jan. 16, 2014

Related U.S. Application Data

(60) Provisional application No. 61/670,980, filed on Jul. 12, 2012, provisional application No. 61/691,606, filed on Aug. 21, 2012.

(51) Int. Cl.
*G06F 17/50*     (2006.01)

(52) U.S. Cl.
USPC .......................... 716/106; 716/104; 716/136

(58) Field of Classification Search
USPC ......................................... 716/104, 106, 136
See application file for complete search history.

(56) References Cited

U.S. PATENT DOCUMENTS

| | | | | |
|---|---|---|---|---|
| 5,920,711 | A * | 7/1999 | Seawright et al. | 703/15 |
| 8,051,402 | B2 * | 11/2011 | Snell | 716/136 |
| 8,140,315 | B2 * | 3/2012 | Walter et al. | 703/14 |
| 8,255,198 | B2 * | 8/2012 | Krishnaswamy et al. | 703/13 |
| 8,560,893 | B1 * | 10/2013 | Hollander et al. | 714/47.1 |
| 8,560,985 | B1 * | 10/2013 | Sahu et al. | 716/106 |
| 2007/0226542 | A1 * | 9/2007 | Beeston et al. | 714/33 |
| 2008/0147372 | A1 * | 6/2008 | Paulsen | 703/14 |
| 2009/0083683 | A1 * | 3/2009 | Snell | 716/5 |
| 2009/0112554 | A1 * | 4/2009 | Walter et al. | 703/14 |
| 2011/0238397 | A1 * | 9/2011 | Chen et al. | 703/13 |
| 2012/0240022 | A1 * | 9/2012 | Bakshi | 715/209 |

* cited by examiner

*Primary Examiner* — Naum Levin
(74) *Attorney, Agent, or Firm* — Mentor Graphics Corporation

(57) ABSTRACT

This application discloses a design verification tool to collect messages generated by a test bench during elaboration of the test bench. The messages can identify connectivity corresponding to library components in the test bench. A debug tool can generate a schematic representation of the test bench having circuit symbols corresponding to at least portions of the library components, which are interconnected with trace lines based, at least in part, on the messages. The debug tool can prompt display of the schematic representation of the test bench.

20 Claims, 12 Drawing Sheets

TEST BENCH HIERARCHY AND CONNECTIVITY IN A DEBUGGING ENVIRONMENT

RELATED APPLICATION

This application claims benefit of and priority to U.S. Provisional Patent Application No. 61/670,980, filed Jul. 12, 2012, and claims benefit of and priority to U.S. Provisional Patent Application No. 61/691,606, filed Aug. 21, 2012, both of which are incorporated by reference herein.

TECHNICAL FIELD

This application is generally related to electronic design automation and, more specifically, to test bench hierarchy and connectivity in a debugging environment

BACKGROUND

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). As part of the creation of a logical design, a designer will also implement a place-and-route process to determine the placement of the various portions of the circuit, along with an initial routing of interconnections between those portions. The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices, such as transistors, resistors, and capacitors, which will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design can be again transformed, this time into a physical design that describes specific geometric elements. This type of design often is referred to as a "layout" design. The geometric elements, which typically are polygons, define the shapes that will be created in various materials to manufacture the circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Typically, a designer will perform a number of analyses on the resulting layout design data. For example, with integrated circuits, the layout design may be analyzed to confirm that it accurately represents the circuit devices and their relationships as described in the device design. The layout design also may be analyzed to confirm that it complies with various design requirements, such as minimum spacings between geometric elements. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes, that modify the layout design data to improve the usable resolution of the reticle or mask created from the design in a photolithographic manufacturing process.

After the layout design has been finalized, it is converted into a format that can be employed by a mask or reticle writing tool to create a mask or reticle for use in a photolithographic manufacturing process. The written masks or reticles then can be used in a photolithographic process to expose selected areas of a wafer to light or other radiation in order to produce the desired integrated microdevice structures on the wafer.

Returning to "functional verification," this type of analysis begins with a circuit design coded at a register transfer level (RTL), which can be simulated by a design verification tool. A designer, for example, utilizing the design verification tool, can generate a test bench that, when input to the simulated circuit design, can allow the design verification tool to analyze the functionality of the simulated circuit design. When the simulated circuit design operates differently than expected in response to the test bench, the designer can attempt to debug the circuit design, for example, to determine which of the gates in the circuit design is incorrectly configured, resulting in the generation of illegal states or transitions.

The design verification tool can record signal states and transitions of the circuit design, often called waveform data, which the designer can review in an attempt to identify a "bug" in the circuit design. The designer typically can utilize a debug tool to review the recorded waveforms, often alongside a source code of the circuit design, in an attempt to locate and address the circuit design failure.

Often, however, the simulated circuit design can operate differently than expected, not due to a "bug" in the circuit design, but due to a defect in the test bench, for example, incorrect stimulus being applied to the simulated circuit design, improper response checking, or both. Thus, the designer may attempt to review a source code for the test bench, states and transitions generated by the test bench during simulation of the circuit design, a source code of the circuit design, and the waveform data, often in unison, to ascertain whether the verification failure was the result of a "bug" in the circuit design, a test bench defect, or both.

As test benches evolved from static configuration coded in a register-transfer language (RTL) into programs that dynamically generate the test bench configuration, many designers rely on standardized components from a methodology library to build their test benches. This reliance on standardized components often leads these designers to have an incomplete understanding of the resultant test benches, such as component hierarchy, connectivity, or the like, which leads to an incorrect understanding of test bench functionality and/or implementation in a test bench environment. Furthermore, since many of these test benches are generated with object-oriented programming languages that are transient in nature, for example, with object components, such as classes, being created and destroyed during execution, these designers do not have access to much of the test bench functionality and/or implementation during simulation of the circuit design.

SUMMARY

This application discloses tools and mechanisms for simulating a circuit design with a test bench, performing functional verification on the simulated circuit design, and, when functional verification fails, initiating a debug process to rectify the failure discovered during functional verification. In some embodiments, a design verification tool can identify library components in a test bench and insert connection calls corresponding to the identified library components in the test bench. During elaboration of the test bench, the design verification tool can capture messages generated in response to the connection calls. A debug tool can utilize the messages to generate a schematic representation of the test bench having circuit symbols corresponding to at least portions of the library components, which are interconnected with trace lines based, at least in part, on the messages. The debug tool can prompt display of the schematic representation of the test bench.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
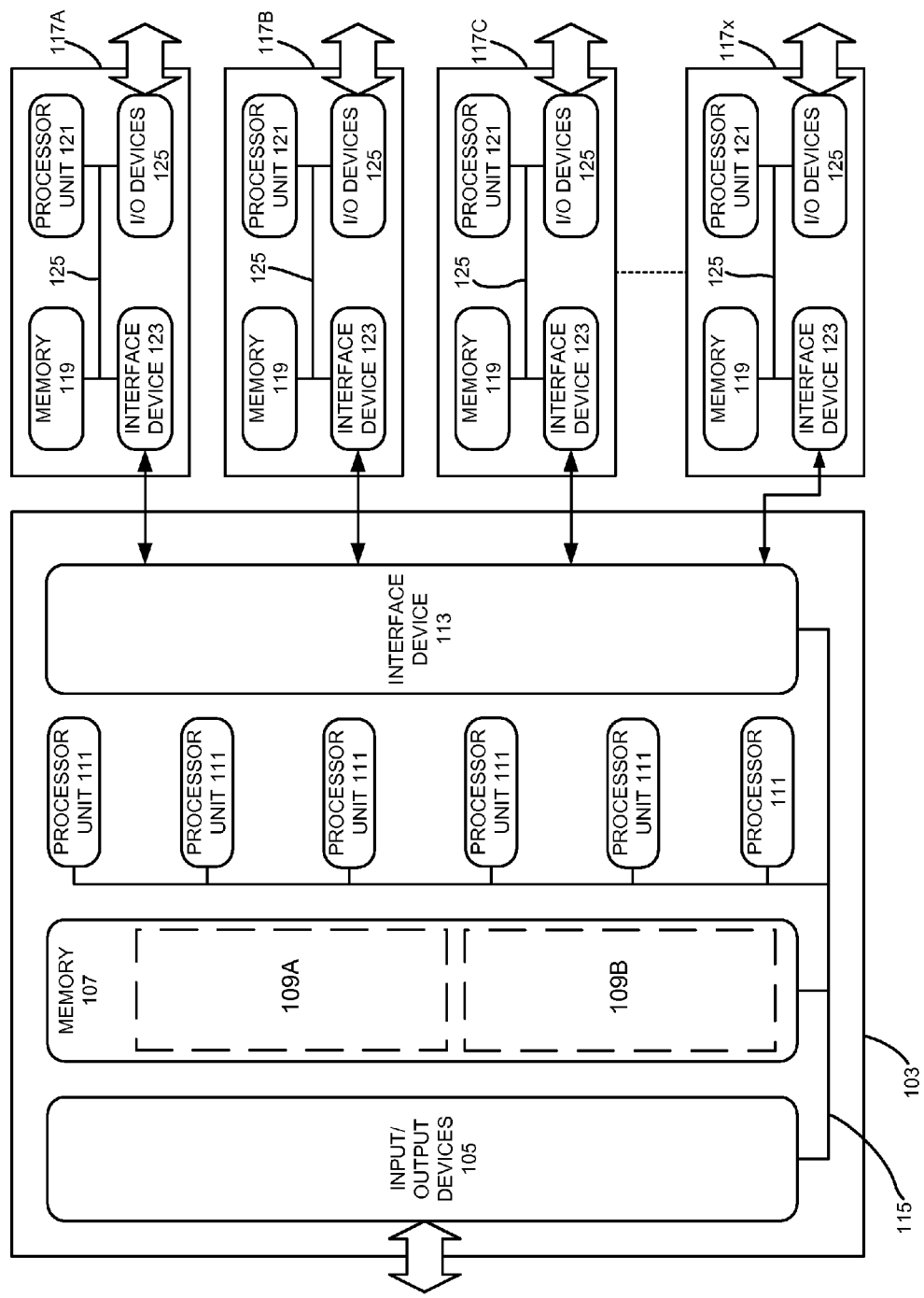
FIGS. 1 and 2 illustrate an example of a computer system of the type that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
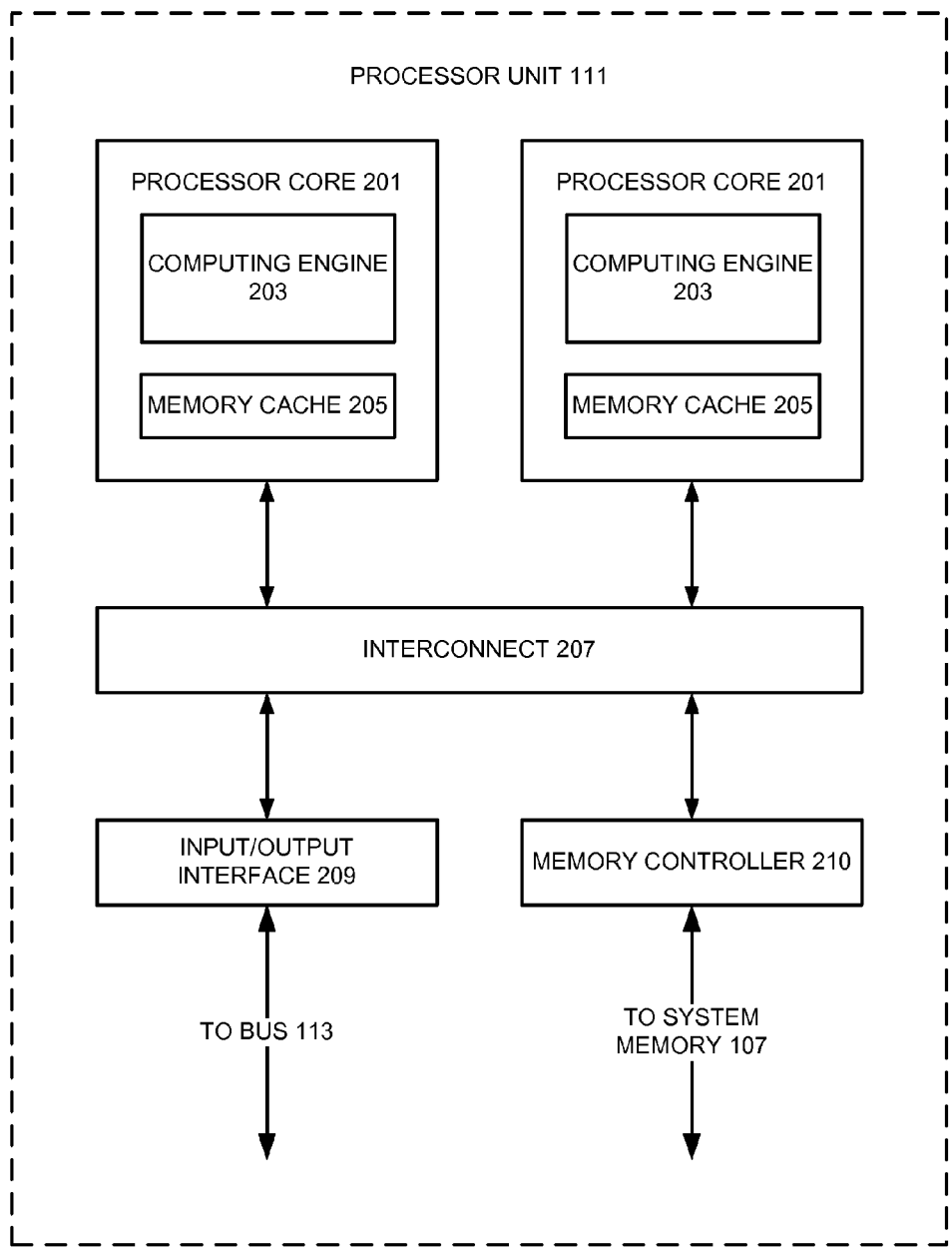

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117*x* through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Debug Tool with Test Bench Characterization

Figure 3:
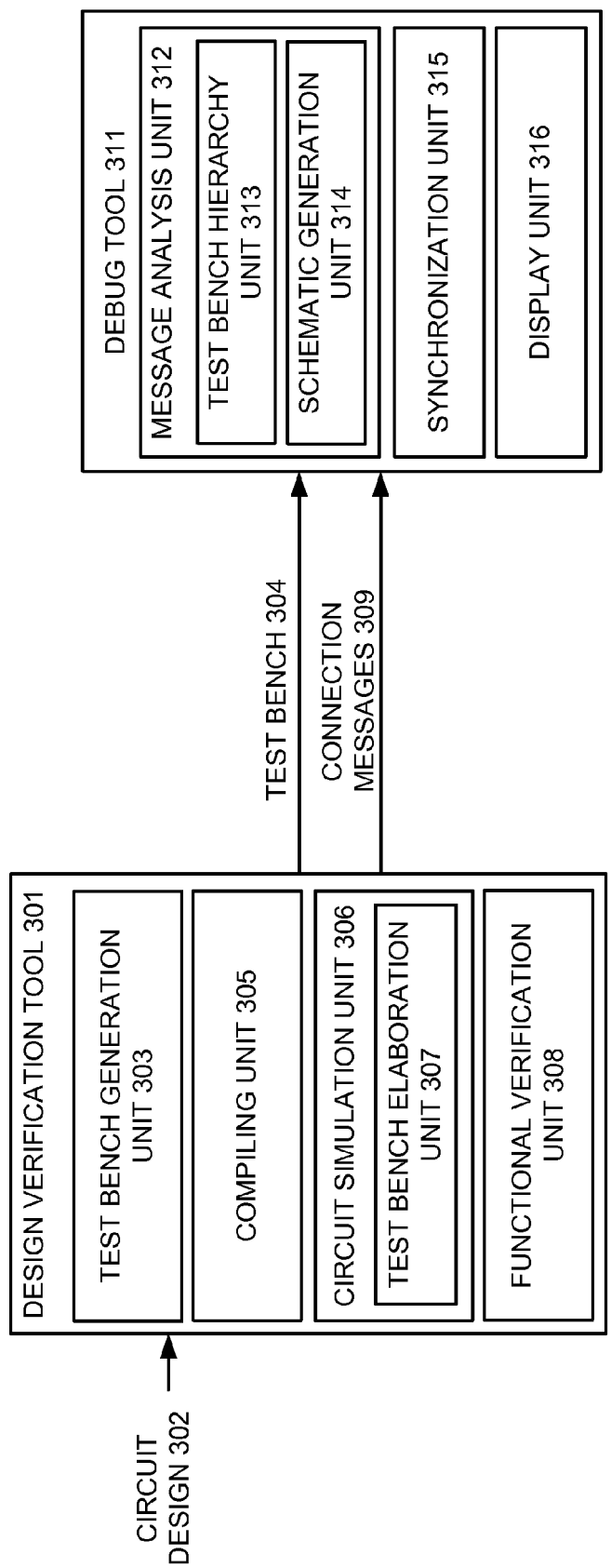
FIG. 3 illustrates an example system including a design verification tool and a debug tool that may be implemented according to various embodiments of the invention.

FIG. 3 illustrates an example system including a design verification tool 301 and a debug tool 311 that may be implemented according to various embodiments of the invention. Although FIG. 3 shows the design verification tool 301 separate from the debug tool 311, in some embodiments, the design verification tool 301 and the debug tool 311 can be integrated into a common tool. Referring to FIG. 3, the design verification tool 301 can receive a circuit design 302, which can describe an electronic device both in terms of an exchange of data signals between components in the electronic device, such as hardware registers, flip-flops, combinational logic, or the like, and in terms of logical operations that can be performed on the data signals in the electronic device. The circuit design 302 can model the electronic device at a register transfer level (RTL), for example, with code in a hardware description language (HDL), such as Verilog, Very high speed integrated circuit Hardware Design Language (VHDL), or the like.

The design verification tool 301 can include a test bench generation unit 303 to generate a test bench 304, which can be utilized to simulate the circuit design 302. The test bench 304 can define test stimuli, for example, clock signals, activation signals, power signals, control signals, and data signals that, when grouped, may form test bench transactions capable of prompting operation of the circuit design 302 during simulation. In some embodiments, the test bench 304 can be written in an object-oriented programming language, for example, SystemVerilog or the like, which, when executed during elaboration, can dynamically generate test bench components for simulation of the circuit design 302. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench 304 and simulating the circuit design 302. The methodology library can include different library components, for example, portions of code that, when executed during elaboration, can simulate test bench components in a simulation environment. In some embodiments, the design verification tool 301 can receive the test bench 304 from a source external to the design verification tool 301, such as a user interface of the computer network 101, or another tool implemented by the computer network 101.

Figure 4:
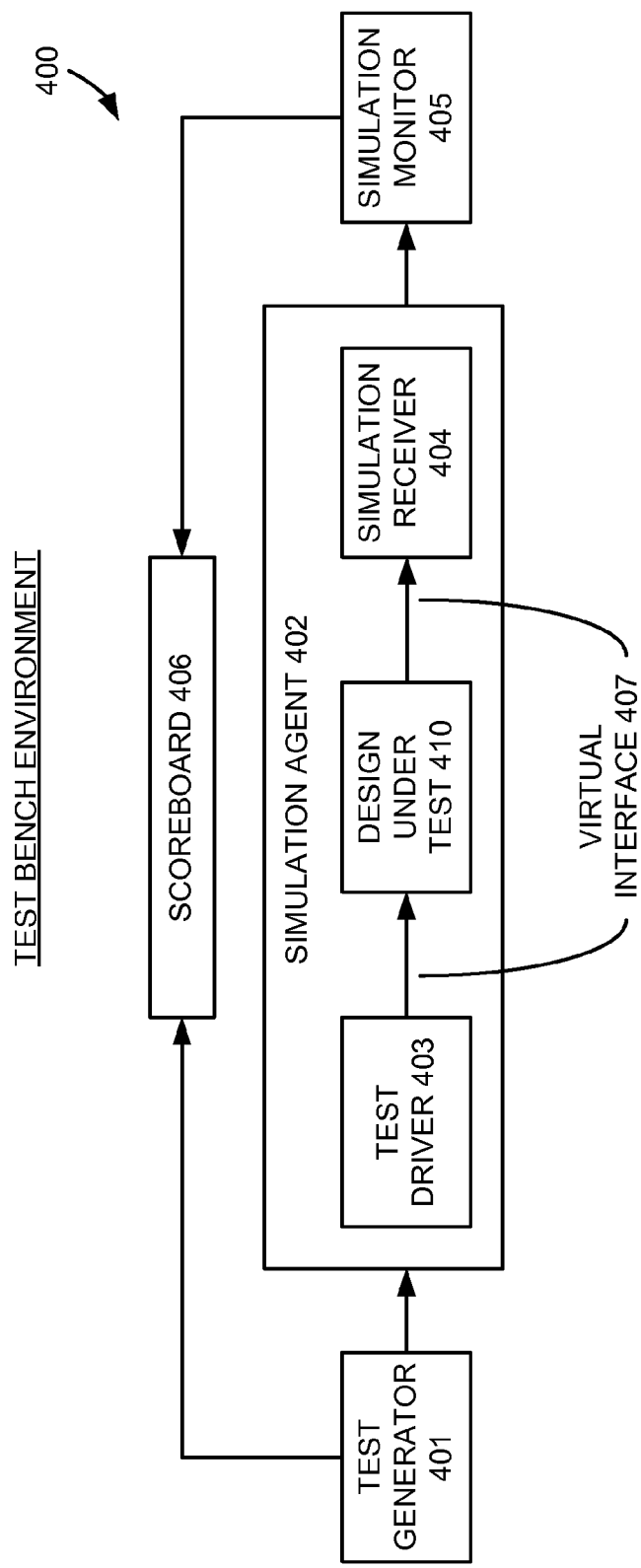
FIG. 4 illustrates an example test bench environment according to various examples of the invention.

FIG. 4 illustrates an example test bench environment 400 according to various examples of the invention. Referring to FIG. 4, the test bench environment 400 shows a high-level representation of a test bench having been elaborated during simulation and a design under test 410, such as the circuit design 302, to be simulated with the test bench. The test bench environment 400 can include a test generator 401 to generate test stimuli, for example, vectors including clock signals, activation signals, power signals, control signals, data signals, or the like. The test generator 401 also can provide the test stimuli to a scoreboard 406 in the test bench environment 400, which can record the test stimuli to be provided to the design under test 410.

The test bench environment 400 can include a simulation agent 402 to receive the test stimuli from the test generator 401, provide the test stimuli to the design under test 410, such as the circuit design 302, receive the simulation results generated by the design under test 410 in response to the test stimuli, and provide the simulation results to a simulation monitor 405. The simulation agent 402 can include a test driver 403 to receive the test stimuli from the test generator 401 and provide the test stimuli to the design under test 410, such as the circuit design 302 through at least one virtual interface 407. The simulation agent 402 can include a simulation receiver 404 to receive the simulation results generated by the design under test 410 in response to the test stimuli and provide the simulation results to a simulation monitor 405 through at least one virtual interface 407. The virtual interface 407 can correspond to one or more ports through which the test bench communicates with external object or designs, such as the design under test 410, in the test bench environment 400.

The simulation monitor 405 can compare the simulation results to an expected output of the design under test 410 in response to the test stimuli. In some embodiments, the test generator 401 can provide the test stimuli to the simulation monitor 405, and the simulation monitor 405 can determine the expected output for the design under test 410 based on the test stimuli from the test generator 401. The simulation monitor 405 can record the results of the comparison to the scoreboard 406.

Referring back to FIG. 3, the design verification tool 301 can include a compiling unit 305 to compile and link the test bench 304 and the circuit design 302. The compiling unit 305 can generate design files, for example, coded in a C-based programming language, which can embody the circuit design 302 and the test bench 304. The compiling unit 305 can check the circuit design 302 and the test bench 304 for syntax errors and issue any warnings in response to an identification of the syntax errors or other issues with the format of the circuit design 302 and/or the test bench 304.

The compiling unit 305 can identify library components in the test bench 304, for example, standardized UVM library components, or the like. The compiling unit 305 can insert connection calls into the test bench 304 corresponding to the identified library components. Embodiments of the insertion of connection calls into the test bench 304 will be described below in greater detail.

The design verification tool 301 can include a circuit simulation unit 306 to simulate the circuit design 302 based, at least in part, on the test bench 304. The circuit simulation unit 306 can include a test bench elaboration unit 307 to elaborate the test bench 304, for example, instantiating objects, classes, or the like, in the compiled test bench 304, to prepare the test bench 304 for simulation of the circuit design 302. The circuit simulation unit 306, during the elaboration process, can construct a hierarchy for the test bench 304 and establish signal connectivity in the test bench 304 based on object instantiation and configuration information for the various library components. The circuit simulation unit 306, during the elaboration process, also can execute the connection calls inserted into the test bench 304 during compilation, which can prompt the circuit simulation unit 306 to generate connection messages 309 corresponding to the hierarchy for the test bench 304 and the signal connectivity in the test bench 304.

The circuit simulation unit 306 can record output created by the circuit design 302, such as waveform data, during simulation with the test bench 304. The design verification tool 301 can include a functional verification unit 308 to compare the waveform data with an expected output from the circuit design 302 in response the test bench 304. The functional verification unit 308 can verify the functionality of the circuit design 302 when the waveform data indicates the circuit design 302 operates as expected based on the comparison. When the waveform data indicates the circuit design 302 operates differently than expected based on the comparison, the functional verification unit 308 can determine a "bug" or other defect is present in the circuit design 302 and/or in the test bench 304. Although FIG. 3 shows the design verification tool 301 including the functional verification unit 308, in some embodiments, the functional verification unit 308 can be located external to the design verification tool 301.

When the functional verification unit 307 determines a "bug" or other defect is present in the circuit design 302 or in the test bench 304, designer(s) can utilize a debug tool 311 to isolate the "bug" in the circuit design 302 and/or test bench 304. The debug tool 311 can receive the test bench 304 and the connection messages 309, optionally along with other information, such as the circuit design 302, the waveform data, test bench simulation log file, or the like, for example, from the design verification tool 301.

The debug tool 311 can include a message analysis unit 312 to develop a representation of the test bench 304 from the connection messages 309. The message analysis unit 312 can include a test bench hierarchy unit 313 to identify a hierarchy of the test bench 304 from the connection messages 309. For example, the message analysis unit 312 can generate a hierarchy tree for the test bench 304 from the connection messages 309. The hierarchy tree can identify various objects derived from library components in the test bench 304 and their corresponding hierarchical location in the test bench. The hierarchy tree also can identify connectivity for the objects derived from the library components, such as messaging connectivity by the objects derived from the library components, which can be internal or external to the test bench 304. Embodiments of generating the hierarchy tree will be described below in greater detail.

The message analysis unit 312 can include a schematic generation unit 314 to generate one or more schematic diagrams of the test bench 304 from the connection messages 309. For example, the schematic generation unit 314 can generate a hierarchical schematic having high-level blocks representing library components. The hierarchical schematic also can include connectivity between the high-level blocks and/or external port connections. The high-level blocks can abstract one or more of the objects derived from the library components, allowing the hierarchical schematic to show an abstracted or hierarchical view of the test bench 304. Embodiments of generating the hierarchical schematic will be described below in greater detail.

In some embodiments, the schematic generation unit 314 can generate a connectivity schematic showing the connectivity of base-level blocks in the test bench 304. The connectivity schematic can be a flat representation of the test bench 304, for example, showing the connections by the objects derived from the library components. Embodiments of generating the connectivity schematic will be described below in greater detail.

The debug tool 311 can include a display unit 316 to prompt display or presentation of one or more debug windows capable of population with the hierarchy tree, the hierarchy schematic, and/or the connectivity schematic. For example, the display unit 316 can prompt presentation of the hierarchy tree alongside the source code of the test bench 304, which can allow the designer(s) to review the hierarchy tree and the source code of the test bench 304 to isolate the "bug" identified by the functional verification unit 308. In some embodiments, the debug tool 311 can synchronize the various data presented in the one or more debug windows.

Figure 5:
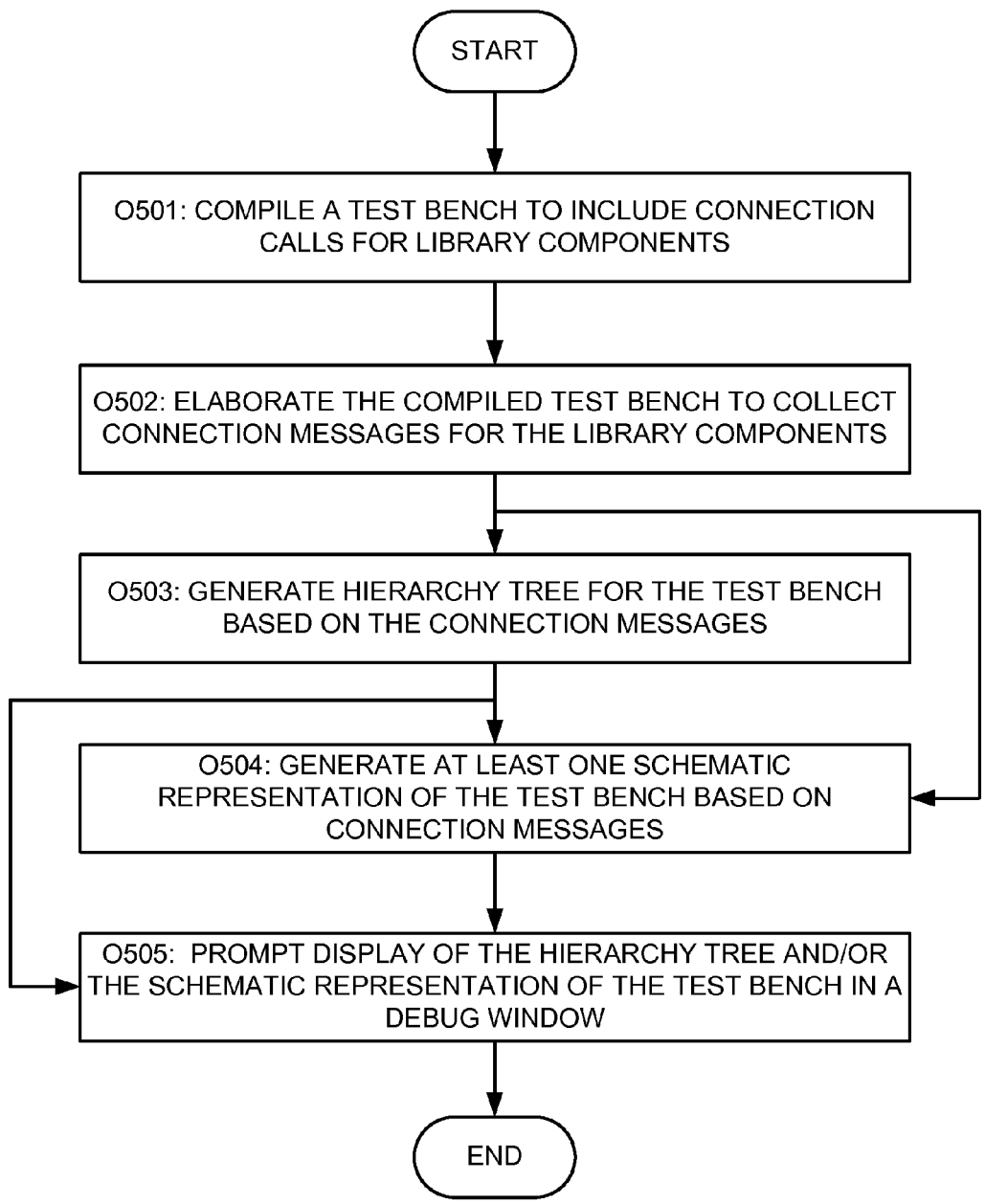
FIG. 5 illustrates a flowchart showing an example generation and display of representation of a test bench in a debug window according to various examples of the invention.

FIG. 5 illustrates a flowchart showing an example generation and display of representation of a test bench in a debug window according to various examples of the invention. Referring to FIG. 5, in a block 501, a design verification tool can compile a test bench to include connection calls for library components. The compilation of the test bench can include identifying library components in the test bench and inserting connection calls corresponding to the test bench, which can allow for the generation of connection messages during elaboration of the test bench.

In a block 502, the design verification tool can elaborate the compiled test bench to collect connection messages for the library components. The design verification tool can generate the connection messages in response to execution of the connection calls inserted during compilation in block 501. The connection messages can indicate a hierarchy for the library components and connectivity for the objects derived from the library components.

In a block 503, a debug tool can generate hierarchy tree for the test bench based on the connection messages. The debug tool can utilize the connection messages to determine the library components, their corresponding sub-parts, and their connections between the sub-parts to populate the hierarchy tree. In some embodiments, the debug tool can identify missing sections of the hierarchy tree after reviewing the connection messages, and infer presence and locations of sub-part in the hierarchy tree, for example, through the naming conventions utilized by the library components. Embodiments of generating the hierarchy tree will be described below in greater detail.

In a block 504, the debug tool can generate at least one schematic representation of the test bench based on the connection messages. The debug tool can utilize the connection messages to determine the objects derived from the library components and the connectivity of those objects. From this information, the debug tool can identify external ports or virtual interfaces for the test bench, internal pass-through ports, and draw various blocks or symbols and interconnections representing the test bench. In some embodiments, the debug tool can draw a hierarchical schematic having blocks corresponding to one or more library components (or portions thereof), which can be abstracting one or more objects derived from the library components within the blocks, draw one or more ports in the blocks corresponding to connections outside of the blocks, and draw trace lines corresponding to connections made by the blocks through the one or more ports. In some embodiments, the debug tool can draw a connectivity schematic having blocks corresponding to one or more objects derived from the library components and draw their corresponding connectivity to other objects derived from the library components or through an external port. Embodiments of generating the schematic representation will be described below in greater detail.

In a block 505, the debug tool can prompt display of the hierarchy tree and/or schematic representation of the test bench in a debug window. The debug tool can include the hierarchy tree, the hierarchy schematic, and/or the connectivity schematic in separate debug windows, which can be synchronized with each other, or combine a plurality of these representations (hierarchy tree or schematic representation) in a common debug window.

Figure 6:
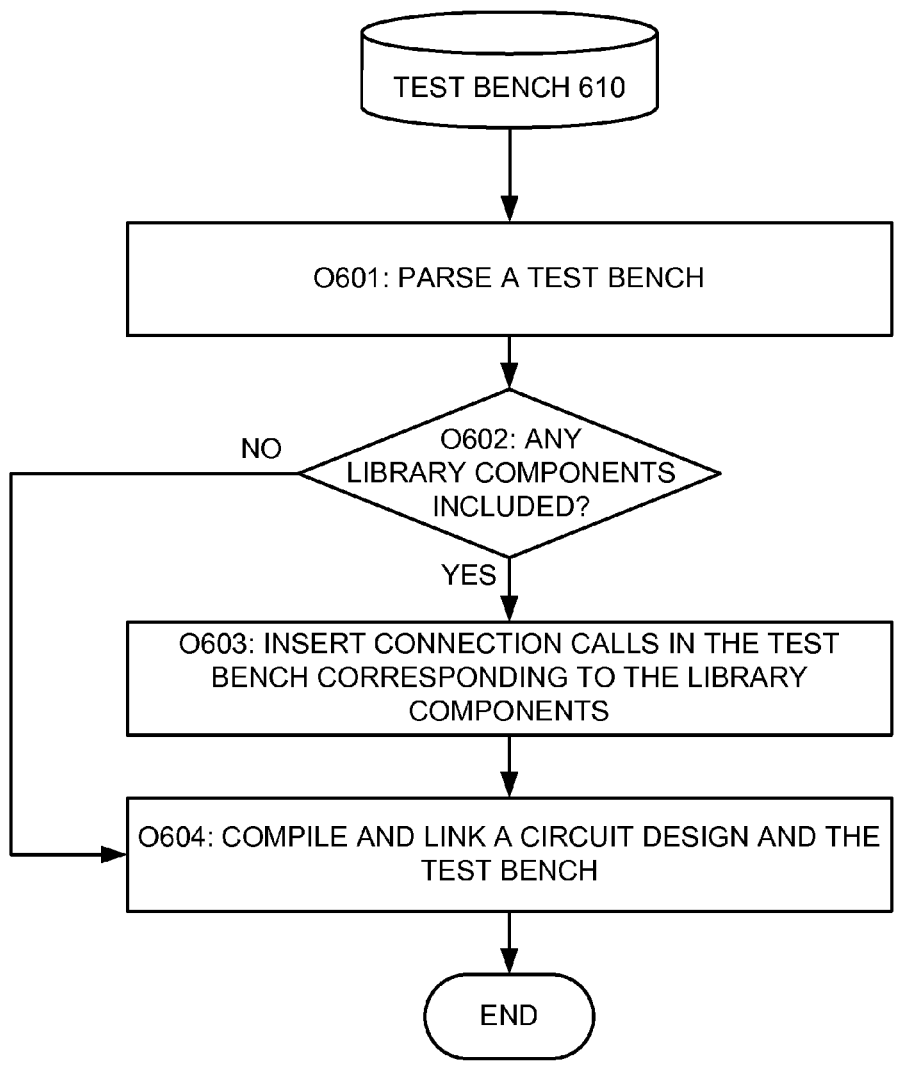
FIG. 6 illustrates a flowchart showing an example compiling of a test bench to include connection calls for library components according to various examples of the invention.

FIG. 6 illustrates a flowchart showing an example compiling of a test bench to include connection calls for library components according to various examples of the invention. Referring to FIG. 6, in a block 601, a design verification tool can parse a test bench, for example, to identify library components in the test bench. In a block 602, the design verification tool can determine whether the test bench includes any library components.

When the test bench includes library components, in a block 603, the design verification tool can insert connection calls in the test bench corresponding to the library components. As discussed above, the connection calls, when executed during the elaboration process, can prompt the design verification tool to generate connection messages corresponding to the hierarchy for the test bench and the signal connectivity in the test bench.

When the test bench does not include library components or after the connection calls have been inserted into the test bench, in a block 604, the design verification tool can compile and link a circuit design and the test bench. In some embodiments, during compiling and linking of the circuit design and the test bench, the design verification tool can generate design files, for example, coded in a C-based programming language, which can embody the circuit design and the test bench. The design verification tool can check the circuit design and the test bench for syntax errors and issue any warnings in response to an identification of the syntax errors or other issues with the format of the circuit design and/or the test bench.

Figure 7A:
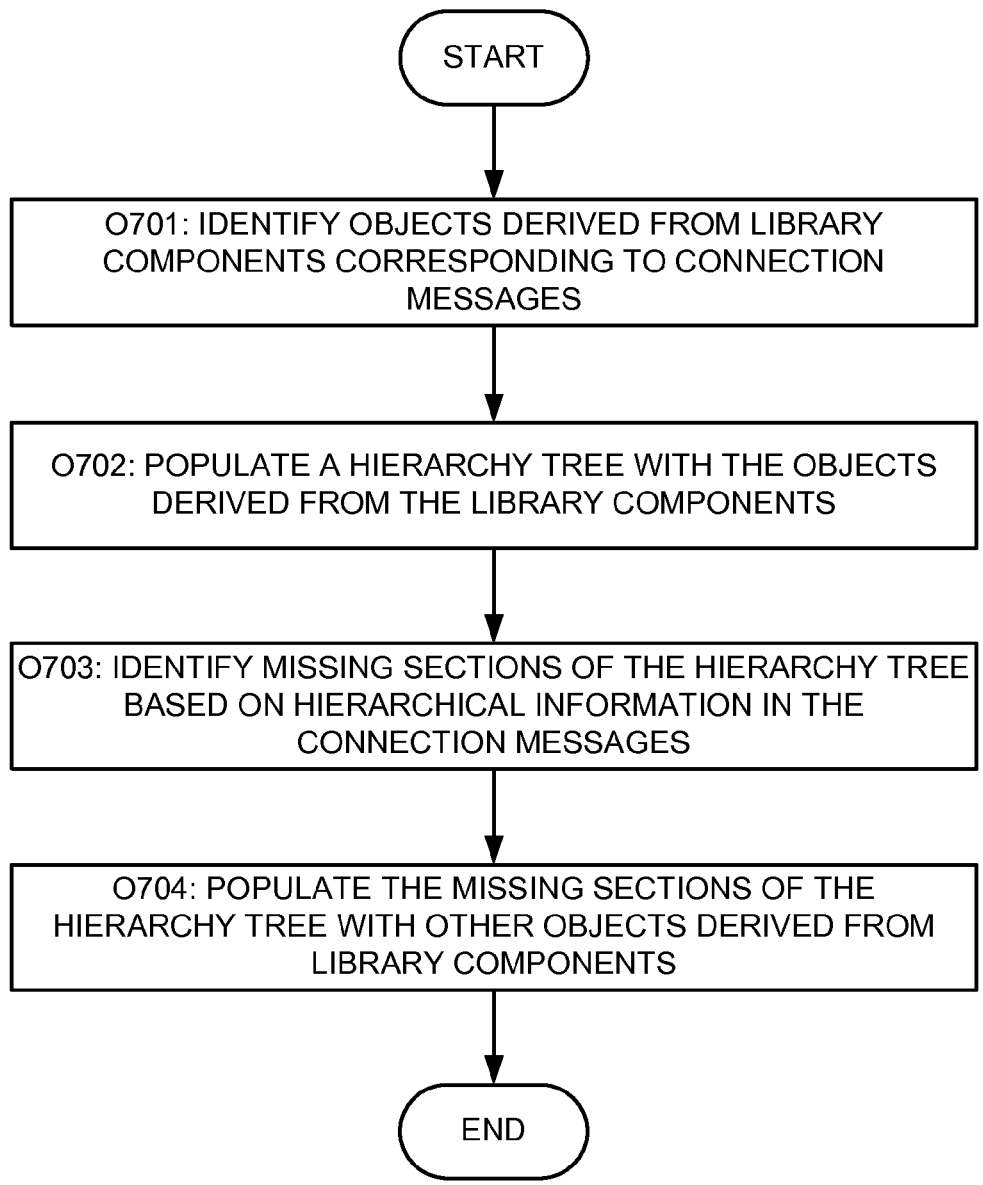
FIGS. 7A and 7B illustrate a flowchart showing an example implementation of generating a hierarchy tree for a test bench and an example debug window to display the hierarchy tree according to various embodiments of the invention.
Figure 7B:
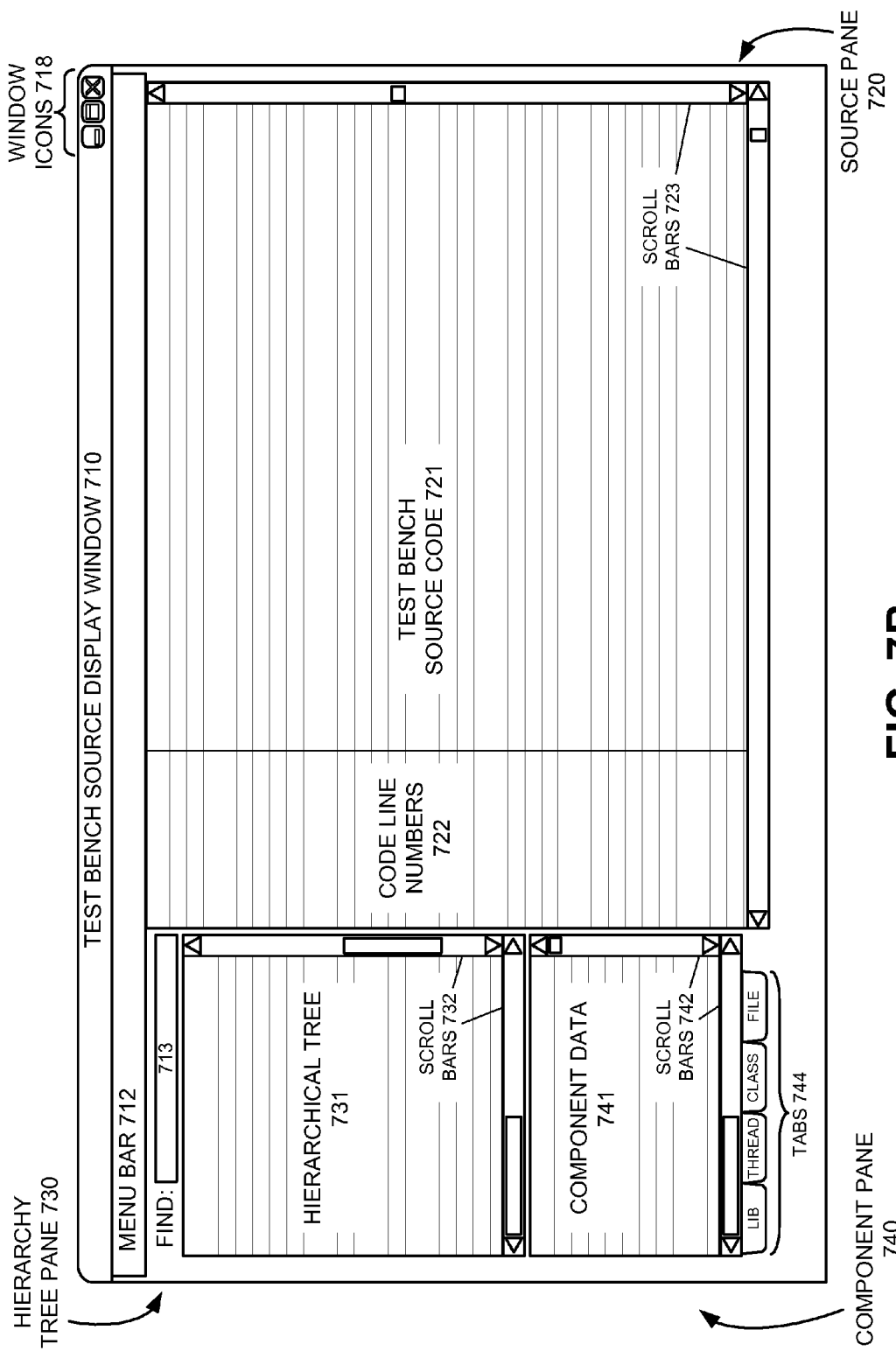

FIGS. 7A and 7B illustrate a flowchart showing an example implementation of generating a hierarchy tree for a test bench and an example debug window to display the hierarchy tree according to various embodiments of the invention. Referring to FIG. 7A, in a block 701, a debug tool can identify objects derived from library components corresponding to connection messages. The connection messages can identify the objects, the connections corresponding to the objects, and the hierarchical information regarding the location of those objects in the hierarchy of the test bench, for example, from a naming convention provided by the library component.

In a block 702, the debug tool can populate a hierarchy tree with the objects derived from the library components. In some embodiments, the debug tool can determine a location of the objects derived from the library components in the hierarchy tree from based on the identification of the objects derived from the library components, their connections to other portions of the test bench, and the hierarchical path of the objects, for example, from the naming conventions of the objects from the library component. In other words, the debug tool can take flat, non-hierarchical information from the connection messages and build a hierarchy tree of the test bench.

In a block 703, the debug tool can identify missing sections of the hierarchy tree based on hierarchical information in the connection messages. The debug tool can assign parent pointers for the objects identified by the connection messages, and determine whether the parent pointers identify an object that previously did not have a corresponding connection message. In some embodiments, the debug tool can identify a parent object and assign the parent pointer based on a naming convention for the object. For example, an object C may have a naming convention A.B.C, which indicates that its parent object would be object B. In this case, the debug tool can assign a parent pointer to object B and identify whether object B was identified by any of the connection messages.

In a block 704, the debug tool can populate the missing sections of the hierarchy tree with other objects derived from the library components. When the debug tool determines that a parent pointer points to an object that was not identified by any of the connection messages, the debug tool can populate the hierarchy tree with the missing object, for example, in a location determined based on the parent pointer.

Referring to FIG. 7B, the test bench source window 710 can include a source pane 720, a hierarchy tree pane 730, and a component pane 740. The source pane 720 can include a test bench source code 721, for example, sequenced by code line numbers 822. In some embodiments, the source pane 720 can be arranged in rows, with each row corresponding to different line in the test bench source code 721. The source pane 720 can include scroll bars 723, that, when selected or moved, for example, in response to user input, can adjust which portions of the test bench source code 721 are viewable in the source pane 720.

The hierarchy tree pane 730 can include a hierarchy tree 731, for example, as generated in FIG. 7A. In some embodiments, the hierarchy tree pane 730 can be arranged in rows, with each row corresponding to different portions and different levels of the hierarchy tree 731. The hierarchy tree pane 730 can include scroll bars 732, which, when selected or moved, for example, in response to user input, can adjust which portion of the hierarchy tree 731 is viewable in the hierarchy tree pane 730.

The component pane 740 can include component data 741, for example, corresponding to one or more selected portions of the hierarchy tree 731 in the hierarchy tree pane 730. In some embodiments, the component pane 740 can be arranged in rows, with each row corresponding to different library component or portions thereof in the hierarchy tree 731. The component pane 740 can include tabs 744, such as a library tab, thread tab, class tab, file tab, or the like, which can select a format for viewing the component data 741, and for the hierarchy tree 731 in the hierarchy tree pane 730. The component pane 740 can include scroll bars 742, that, when selected or moved, for example, in response to user input, can adjust which portions of the component data 741 are viewable in the component pane 740.

The source pane 720, the hierarchy tree pane 730, and the component pane 740 can be interrelated, with a selection of a row in one pane causing corresponding portions of the other panes to automatically scroll into view and optionally be highlighted or otherwise have their presentation altered to annunciate their presence in the corresponding panes. For example, a selection of a at least one portion of the hierarchy tree 731 in the hierarchy tree pane 730 can cause a portion of the test bench source code 721 in the source pane 720 and a portion of the component data 741 in the component pane 740 to automatically scroll into view and optionally be highlighted or otherwise have their presentation altered to annunciate their presence.

The test bench source display window 710 can include a menu bar 712 having various mechanisms to selectively sort, filter, organize, populate, or the like, the source pane 720, the hierarchy tree pane 730, and the component pane 740. The test bench source display window 710 also can include window icons 718, which can control sizing of the test bench source display window 710, such as enlarging, shrinking, minimizing, or the like, and closing of the test bench source display window 710.

Figure 8A:
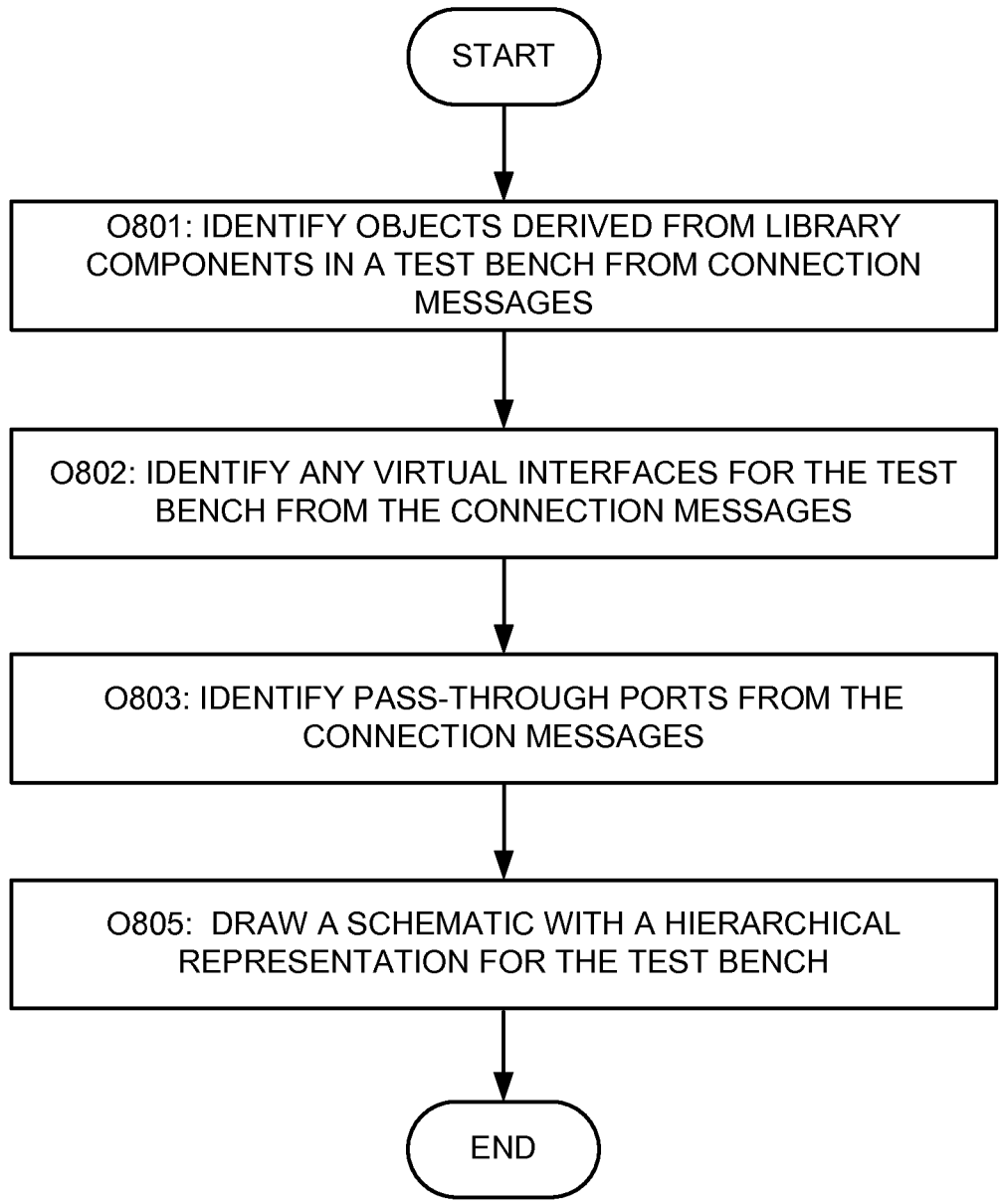
FIGS. 8A and 8B illustrate a flowchart showing an example implementation of generating a schematic having a hierarchical representation for a test bench and an example debug window to display the schematic according to various embodiments of the invention.
Figure 8B:
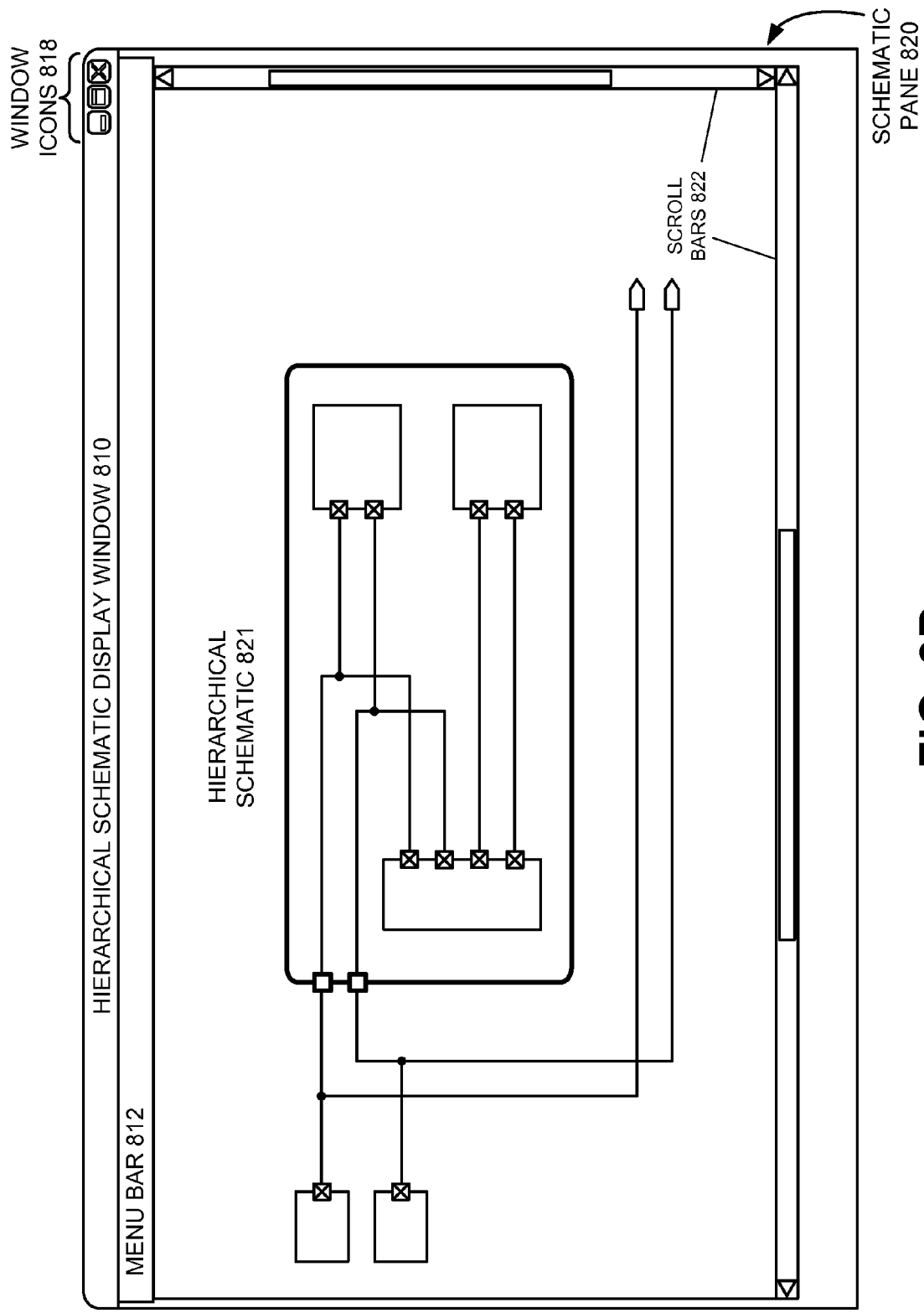

FIGS. 8A and 8B illustrate a flowchart showing an example implementation of generating a schematic having a hierarchical representation for a test bench and an example debug window to display the schematic according to various embodiments of the invention. Referring to FIG. 8A, in a block 801, a debug tool can identify objects derived from library components in a test bench from connection messages. In some embodiments, the connection messages can identify connectivity for those objects in the test bench, while its naming convention can correlate the library components to the objects.

In a block 802, the debug tool can identify any virtual interfaces for the test bench from the connection messages. The debug tool can review the connection messages to determine, which objects communicate with a design external from the test bench, such as a circuit design or design under test. These external communications can be identified as virtual interfaces for the test bench.

In a block 803, the debug tool can identify pass-through ports from the connection messages. The debug tool can review the connection messages to determine, which objects communicate with objects external to their library component. These external communications can be identified as pass-through ports.

In a block 804, the debug tool can draw a schematic with a hierarchical representation for the test bench. The debug tool, in some instances, can draw a block or symbol for each library component, draw ports in the block or symbol corresponding to virtual interfaces and pass-through ports, and then draw trace lines corresponding to the connectivity of the objects in the library components.

Referring to FIG. 8B, the hierarchical schematic display window 810 can include a schematic pane 820 having a hierarchical schematic 821. The hierarchical schematic 821 can include various symbols representing library components, each including one or more objects derived by that library component during elaboration. The symbols representing library components can each include ports corresponding to external communication from the corresponding library component. The hierarchical schematic 821 can include virtual interface ports corresponding to external communication from the test bench. Since the symbols representing library components are an abstraction of a hierarchy of objects derived from the library components, this representation of the test bench can be called a hierarchical schematic 821 or a schematic with a hierarchical representation.

The schematic pane 820 can include scroll bars 822, that, when selected or moved, for example, in response to user input, can adjust which portions of the hierarchical schematic display window 810 are viewable in the schematic pane 820. The hierarchical schematic display window 810 can include a menu bar 812 having various mechanisms to selectively sort, filter, organize, populate, or the like, the schematic pane 820. The hierarchical schematic display window 810 also can include window icons 818, which can control sizing of the hierarchical schematic display window 810, such as enlarging, shrinking, minimizing, or the like, and closing of the hierarchical schematic display window 810.

In some embodiments, operations in the hierarchical schematic display window 810 can be coordinated or synchronized with the test bench source display window 710. For example, the test bench source display window 710 can be displayed and/or populated based on one or more selections in the hierarchical schematic display window 810. Conversely, a selection in the test bench source display window 710 can cause the hierarchical schematic display window 810 to be displayed and/or become populated at least with corresponding portions of the hierarchical schematic 821, or, when previously populated with the hierarchical schematic 821, the hierarchical schematic display window 810 can automatically scroll corresponding portions of the hierarchical schematic 821 into view in the hierarchical schematic display window 810, and optionally be highlighted or otherwise have their presentation altered to annunciate their presence in the hierarchical schematic display window 810.

Figure 9A:
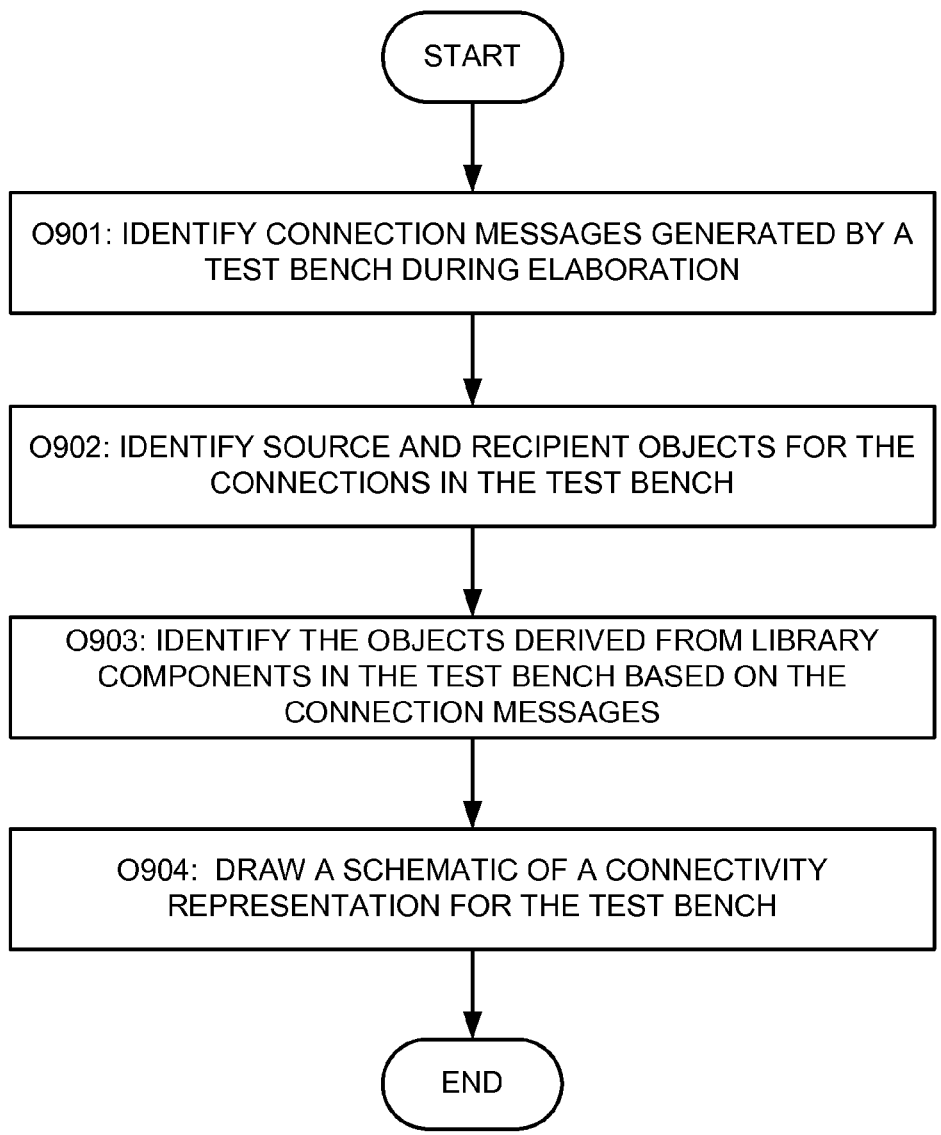
FIGS. 9A and 9B illustrate a flowchart showing an example implementation of generating a schematic having a connectivity representation for a test bench and an example debug window to display the schematic according to various embodiments of the invention.
Figure 9B:
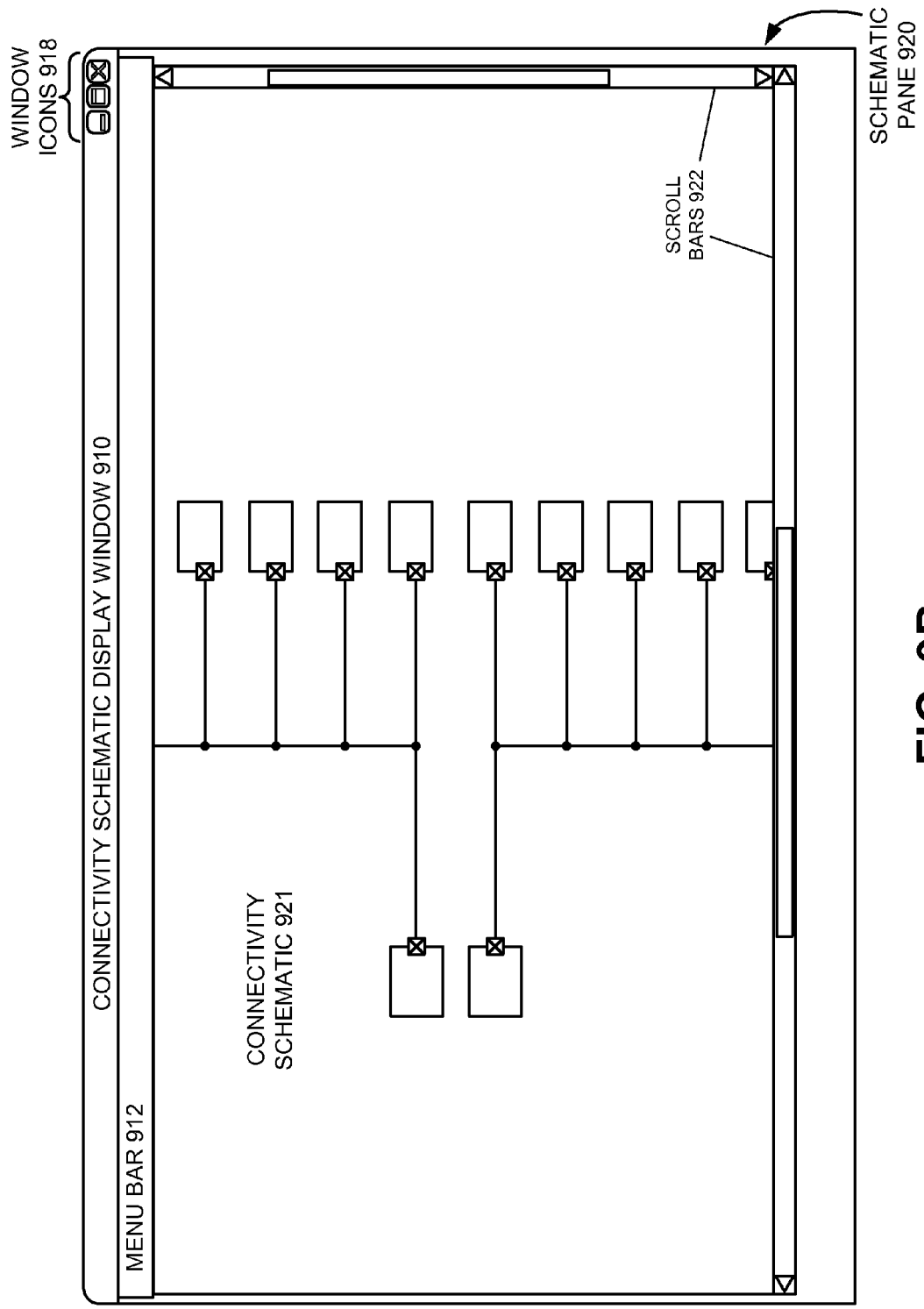

FIGS. 9A and 9B illustrate a flowchart showing an example implementation of generating a schematic having a connectivity representation for a test bench and an example debug window to display the schematic according to various embodiments of the invention. Referring to FIG. 9A, in a block 901, a debug tool can identify connection messages generated by a test bench during elaboration. In some embodiments, these connection messages can be provided to the debug tool by a design verification tool, which simulated the circuit design with the test bench.

In a block 902, the debug tool can identify source and recipient objects from the connections in the test bench. In some embodiments, the library components can include lists of objects having communication "provided by" and "provided to," which can identify source objects and recipient objects, respectively, for various connections in the test bench. The identification of the source and recipient objects also can identify a directionality of the communication in the test bench.

In a block 903, the debug tool can identify objects derived from the library components in the test bench based on the connection messages. The identification of the objects can be flat information, except for the objects names, which can connote a hierarchical relationship between different objects.

In a block 904, the debug tool can draw a schematic of a connectivity representation for the test bench, for example, based on the identification of the objects and the connectivity by those objects. The debug tool, in some instances, can draw a block or symbol for each object derived by the library components, draw ports in the block or symbols corresponding to virtual interfaces and pass-through ports, and then draw trace lines corresponding to the connectivity of the objects.

Referring to FIG. 9B, the connectivity schematic display window 910 can include a schematic pane 920 having a connectivity schematic 921. The connectivity schematic 921 can include various symbols representing objects derived from library components. The symbols representing the objects derived from the library components can each include ports corresponding to external communication from the corresponding objects. The connectivity schematic can include trace lines coupling the symbols via the ports based on the connectivity by those objects represented by the symbols. This representation of the test bench—showing connectivity of various objects in the test bench—can be a flat, non-hierarchical representation of the test bench.

The schematic pane 920 can include scroll bars 922, that, when selected or moved, for example, in response to user input, can adjust which portions of the connectivity schematic display window 910 are viewable in the schematic pane 920. The connectivity schematic display window 910 can include a menu bar 812 having various mechanisms to selectively sort, filter, organize, populate, or the like, the schematic pane 920. The connectivity schematic display window 910 also can include window icons 918, which can control sizing of the connectivity schematic display window 910, such as enlarging, shrinking, minimizing, or the like, and closing of the connectivity schematic display window 910.

In some embodiments, operations in the connectivity schematic display window 910 can be coordinated or synchronized with the test bench source display window 710 and/or the hierarchical schematic display window 810. For example, the test bench source display window 710 can be displayed and/or populated based on one or more selections in the connectivity schematic display window 910. Conversely, a selection in the test bench source display window 710 can cause the connectivity schematic display window 910 to be displayed and/or become populated at least with corresponding portions of the connectivity schematic 921, or, when previously populated with the connectivity schematic 921, the connectivity schematic display window 910 can automatically scroll corresponding portions of the connectivity schematic 921 into view in the connectivity schematic display window 910, and optionally be highlighted or otherwise have their presentation altered to annunciate their presence in the connectivity schematic display window 910. In another example, the hierarchical schematic display window 810 can be displayed and/or populated based on one or more selections in the connectivity schematic display window 910. Conversely, a selection in the hierarchical schematic display window 810 can cause the connectivity schematic display window 910 to be displayed and/or become populated at least with corresponding portions of the connectivity schematic 921, or, when previously populated with the connectivity schematic 921, the connectivity schematic display window 910 can automatically scroll corresponding portions of the connectivity schematic 921 into view in the connectivity schematic display window 910, and optionally be highlighted or otherwise have their presentation altered to annunciate their presence in the connectivity schematic display window 910.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    elaborating, by a computing system, a test bench that includes connection calls configured to generate messages during the elaboration of the test bench;
    collecting, by the computing system, the messages generated by the connection calls in the test bench during the elaboration of the test bench, wherein the messages identify connectivity corresponding to library components in the test bench;
    generating, by the computing system, a schematic representation of the test bench having circuit symbols corresponding to at least portions of the library components, which are interconnected with trace lines based, at least in part, on the messages; and
    prompting, by a computing system, display of the schematic representation of the test bench.

2. The method of claim 1, further comprising identifying, by the computing system, an internal hierarchy for each of the library components based, at least in part, on the messages, wherein generating the schematic representation of the test bench includes drawing the circuit symbols for the library components based on the internal hierarchy for each of the library components.

3. The method of claim 1, further comprising compiling, by the computing system, the test bench, which inserts connection calls corresponding to the library components in the test bench.

4. The method of claim 1, wherein the schematic representation includes a hierarchical representation of the test bench with the circuit symbols abstracted to a library component-level based, at least in part, on the messages.

5. The method of claim 1, wherein the schematic representation include a flat representation of the test bench with the circuit symbols corresponding to objects derived from the library components based, at least in part, on the messages.

6. The method of claim 1 further comprising:
    identifying, by the computing device, objects derived from the library components based on the messages;
    identifying, by the computing device, other objects derived from the library components linked to the identified objects derived from the library components; and
    generating, by the computing device, a hierarchy tree for the test bench that includes the identified objects and the identified other objects.

7. The method of claim 1, further comprising dynamically generating, by the computing device, test bench components during elaboration of the test bench in response to execution of the test bench by the computing device.

8. A system comprising:
    a design verification tool configured to identify library components in a test bench and insert connection calls in the test bench corresponding to the identified library components in the test bench, wherein the design verification tool is configured to capture messages generated in response to the connection calls during elaboration of the test bench; and
    a debug tool configured to generate a schematic representation of the test bench having circuit symbols corresponding to at least portions of the library components, which are interconnected with trace lines based, at least in part, on the messages.

9. The system of claim 8, wherein the debug tool is configured to prompt display of the schematic representation of the test bench.

10. The system of claim 8, wherein the schematic representation includes a hierarchical representation of the test bench with the circuit symbols abstracted to a library component-level based, at least in part, on the messages.

11. The system of claim 8, wherein the schematic representation include a flat representation of the test bench with the circuit symbols corresponding to objects derived from the library components based, at least in part, on the messages.

12. The system of claim 8, wherein the debug tool is configured to develop a hierarchy tree for the test bench based, at least in part, on the messages, and generate the schematic representation of the test bench based, at least in part, on the hierarchy tree.

13. The system of claim 8, wherein the library components include one or more universal verification methodology (UVM) library components.

14. An apparatus comprising at least one computer-readable memory device storing instructions configured to cause one or more processing devices to perform operations comprising:
    elaborating a test bench that includes connection calls configured to generate messages during the elaboration of the test bench;
    collecting the messages generated by the connection calls in the test bench during the elaboration of the test bench, wherein the messages identify connectivity corresponding to library components in the test bench;
    generating a schematic representation of the test bench having circuit symbols corresponding to at least portions of the library components, which are interconnected with trace lines based, at least in part, on the messages; and
    prompting display of the schematic representation of the test bench.

15. The apparatus of claim 14, wherein the instruction are configured to cause one or more processing devices to perform operations further comprising identifying, by the computing system, an internal hierarchy for each of the library components based, at least in part, on the messages, wherein generating the schematic representation of the test bench includes drawing the circuit symbols for the library components based on the internal hierarchy for each of the library components.

16. The apparatus of claim 14, wherein the instruction are configured to cause one or more processing devices to perform operations further comprising compiling the test bench, which inserts connection calls corresponding to the library components in the test bench.

17. The apparatus of claim 14, wherein the schematic representation includes a hierarchical representation of the test bench with the circuit symbols abstracted to a library component-level based, at least in part, on the messages.

18. The apparatus of claim 14, wherein the schematic representation include a flat representation of the test bench with the circuit symbols corresponding to objects derived from the library components based, at least in part, on the messages.

19. The apparatus of claim 14, wherein the instruction are configured to cause one or more processing devices to perform operations further comprising:
    identifying objects derived from the library components based on the messages;

identifying other objects derived from the library components linked to the identified objects derived from the library components; and generating a hierarchy tree for the test bench that includes the identified objects and the identified other objects.

20. The apparatus of claim 19, wherein generating the schematic representation is performed based, at least in part, on the hierarchy tree.

* * * * *